United States Patent
Saeki

(10) Patent No.: US 8,207,611 B2
(45) Date of Patent: Jun. 26, 2012

(54) SEMICONDUCTOR DEVICE AND FABRICATION METHOD THEREOF

(75) Inventor: Katsutoshi Saeki, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 145 days.

(21) Appl. No.: 12/324,824

(22) Filed: Nov. 26, 2008

(65) Prior Publication Data

US 2009/0140437 A1  Jun. 4, 2009

(30) Foreign Application Priority Data

Nov. 29, 2007  (JP) .................... 2007-309177

(51) Int. Cl.
*H01L 23/48* (2006.01)

(52) U.S. Cl. ... 257/773; 257/775; 257/776; 257/E23.07; 257/E23.145; 257/E23.151

(58) Field of Classification Search .................. 257/773, 257/775, 776, 629, 314, 202, 390, 315, E27.102, 257/E27.103, E29.129, E23.07, E23.143, 257/E23.145, E23.151, E23.168, E23.175, 257/E21.68, E21.683; 438/666, 257

See application file for complete search history.

(56) References Cited

U.S. PATENT DOCUMENTS

| | | | | |
|---|---|---|---|---|
| 5,281,555 A | * | 1/1994 | Cho | .............................. 438/625 |
| 6,128,209 A | | 10/2000 | Kuroki | |
| 6,197,639 B1 | * | 3/2001 | Lee et al. | ...................... 438/258 |
| 6,407,464 B1 | * | 6/2002 | Terauchi | ...................... 257/296 |

FOREIGN PATENT DOCUMENTS

| | | |
|---|---|---|
| JP | 11340431 | 12/1999 |
| JP | 2009135223 | 6/2009 |

* cited by examiner

*Primary Examiner* — Julio J Maldonado

(74) *Attorney, Agent, or Firm* — Taft Stettinius & Hollister LLP

(57) ABSTRACT

A semiconductor device including an intermediate insulating film formed over a plurality of first conductors over a semiconductor substrate. Contact holes are formed in the intermediate insulating film over the first conductors, and contact plugs are buried in the contact holes, respectively. A plurality of second conductors are formed over the plurality of contact plugs on the intermediate insulating film, respectively, and are electrically connected to the plurality of first conductors via the contact plugs. In certain regions of the semiconductor device, the contact plugs may terminate within the intermediate insulating film, thereby electrically insulating the second conductors from the first conductors.

16 Claims, 8 Drawing Sheets

SEMICONDUCTOR DEVICE AND FABRICATION METHOD THEREOF

CROSS REFERENCE TO RELATED APPLICATION

This application claims the benefit of Japanese Patent Application No. 2007-309177, filed Nov. 29, 2007, which is incorporated by reference.

BACKGROUND

The present disclosure relates to a semiconductor device, and, more particularly, to a wiring layout and structure within a memory cell structure of a semiconductor memory device.

An exemplary wiring layout and structure of a memory cell of a conventional semiconductor memory device is illustrated in FIGS. 1A, 1B, and 2. A semiconductor memory device includes a memory cell array portion (MCA) 100 having a plurality of mutually parallel word lines (WL) 102, a plurality of bit lines (BL) 104 intersecting the plurality of word lines 102, and a plurality of memory cells (MC) 106 formed at intersections of the word lines 102 and the bit lines 104, and a peripheral portion where peripheral circuits such as a sense amplifier or a decoder are formed.

In the memory cell array portion 100 where the memory cells 106 are formed, the element integration level is high, and a fine pattern is formed. In the peripheral portion where the peripheral circuits are formed, the element integration level is lower than that of the memory cell array portion 100, and a coarse pattern is formed. In general, the spaces between the wiring and elements are wide.

During a photolithography process, in the vicinity of the boundary of the fine pattern and the coarse pattern, the resist application becomes uneven, or the amount of exposure becomes uneven due to diffracted light. Moreover, a loading effect may occur due to a different etching rate during an etching process, depending on a difference in density of a chip pattern on a semiconductor wafer: the etching rate is high in the fine pattern while it is low in the coarse pattern. For these reasons, a problem may arise in that the dimension or shape of the word lines 102, the bit lines 104, or the contact plugs (hereinafter, referred to simply as contacts) differs between the interior (high-density pattern) and near the exterior (low-density pattern) of the memory cell array portion 100. As used herein, density generally refers to the number of contact plugs per unit area. In other words, there are more contact plugs per unit area in a higher density area than in a lower density area.

To solve such a problem, in a conventional semiconductor memory device, dummy word lines 108, dummy bit lines, or dummy contacts 110 are arranged near the exterior 101 of the memory cell array portion 100. With such an arrangement, the dimensions or shapes of the word lines 102, the bit lines 104, or the contacts (which are actually used) near the exterior 101 of the memory cell array portion 100 are made the same as these in the interior of the memory cell array portion 100.

FIGS. 1A and 1B illustrate an example in which both the dummy word lines 108 and the dummy contacts 110 are arranged near the exterior 101 of the memory cell array portion 100. FIG. 2 illustrates an example in which only the dummy word lines 108 are arranged near the exterior 101 of the memory cell array portion 100. See, for example, Japanese Patent No. 3575988, which is incorporated by reference.

The semiconductor memory device having the conventional structure described above with reference to FIGS. 1A, 1B, and 2 has several problems. In the example of FIGS. 1A and 1B, uniform dimensions and shapes of the word lines 102 and the contacts 112 can be ensured up to the exterior 101 of the memory cell array portion 100. However, when the dummy contacts 110 are short-circuited with the dummy word lines 108, it may lead to a problem that the dummy word lines 108 and the bit lines 104 are also short-circuited. Such a problem is particularly considerable when a self-aligned contact is used for forming of the contacts. In the self-aligned contact, since a mask insulating film serving as an etching stop is formed on a gate electrode, it is possible to form a contact that is not electrically connected to the gate electrode even when it is vertically misaligned, so that the distance between gates can be reduced and, thus, a high integration level can be realized.

As a countermeasure, in the example of FIG. 2 illustrating a technique disclosed in Japanese Patent No. 3575988, only the dummy word lines 108 are arranged near the exterior 101 of the MCA 100, while the dummy contacts 110 are not. With such an arrangement, the dummy contacts 110 are not short-circuited with the dummy word lines 108. However, since the dummy contacts 110 are not present, in a case where it is difficult to ensure a uniform dimension or shape of the contacts 112 in the vicinity of the boundary of the fine pattern and the coarse pattern, the contacts 112 might be short-circuited with the word lines 102, and, thus, the word lines 102 and the bit lines 104 might also be short-circuited.

INTRODUCTION

The present semiconductor device and fabrication method thereof has been made in view of the above-described problems, and an object is to provide a semiconductor device and a fabrication method thereof capable of preventing short-circuiting between a word line and a bit line by means of a novel layout and structure of a dummy contact. Exemplary embodiments include a semiconductor device including an intermediate insulating film formed over a plurality of first conductors over a semiconductor substrate. Contact holes are formed in the intermediate insulating film over the first conductors, and contact plugs are buried in the contact holes, respectively. A plurality of second conductors are formed over the plurality of contact plugs on the intermediate insulating film, respectively, and are electrically connected to the plurality of first conductors via the contact plugs. In certain regions of the semiconductor device, the contact plugs may terminate within the intermediate insulating film, thereby electrically insulating the second conductors from the first conductors.

An exemplary semiconductor device includes an intermediate insulating film formed on a plurality of first conductors on a semiconductor substrate; a plurality of contact holes formed in the intermediate insulating film and disposed over the plurality of first conductors; a plurality of contact plugs in the plurality of contact holes, respectively; and a plurality of second conductors formed over the plurality of contact plugs in the intermediate insulating film, respectively, and electrically connected to the plurality of first conductors via the contact plugs. The semiconductor substrate has formed thereon a first element region where the plurality of first conductors and the plurality of contact plugs are provided in a first density; and a second element region disposed at least partially around the first element region, where the plurality of first conductors and the plurality of contact plugs are provided in a second density lower than the first density. The first element region includes an outermost region disposed near the second element region, in which at least one of the contact plugs is terminated below an upper surface of the intermediate insulating film.

In a detailed embodiment, the first element region may be a memory cell array portion including a plurality of memory cells, and each of the contact plugs may be formed over active regions of two neighboring memory cells. In another detailed embodiment, each of the contact plugs of the first element region other than the outermost region may include a first level contact portion connected to the first conductor and a second level contact portion stacked on the first level contact portion, and a plurality of the contact plugs of the outermost region of the first element region may include only a respective first contact portion connected to the first conductor and may not include a second level contact portion. In another detailed embodiment, the first level contact portion and the second level contact portion may have generally planar shapes and the first level contact portion may be wider than the second level contact portion. In another detailed embodiment, the second level contact portion may be disposed near a central portion of the first level contact portion.

In an exemplary method of fabricating a semiconductor device, the semiconductor device may include an intermediate insulating film formed over a plurality of first conductors over a semiconductor substrate having a plurality of semiconductor elements formed thereon, a plurality of contact holes formed in the intermediate insulating film and disposed over the plurality of first conductors, a plurality of contact plugs in the plurality of contact holes, respectively; and a plurality of second conductors formed over at least some of the plurality of contact plugs in the intermediate insulating film, respectively, and electrically connected to the plurality of first conductors via the contact plugs, and the method may include forming, over the semiconductor substrate, a first element region where the plurality of first conductors and the plurality of contact plugs are provided in a first density, and a second element region disposed at least partially around the first element region, where the plurality of first conductors and the plurality of contact plugs are provided in a second density lower than the first density; forming a first intermediate insulating film over the first and second element regions; forming at least one first level contact hole in the first intermediate insulating film disposed over at least one of the first conductors and the semiconductor elements in the first element region; forming at least one first level contact hole in the first intermediate insulating film disposed over at least one of the first conductors and the semiconductor elements in the second element region; forming first level contact plugs in the at least one first level contact hole in the first element region and in the at least one first level contact hole in the second element region by burying a conductive material in the first level contact holes connected to the respective first conductor or the semiconductor element; forming a second intermediate insulating film over the first level contact holes and the first intermediate insulating film; forming a second level contact hole in the second intermediate insulating film disposed over the first level contact hole in the first element region while leaving the second intermediate insulating film in place over the first level contact hole in the second element region; burying a conductive material in the second level contact hole to form a second contact portion connected to the conductive material buried in the first level contact hole in the first element region; and forming at least one second conductor on the second intermediate insulating film and the second level contact hole.

In a detailed embodiment, the first level contact hole and the second level contact hole may have generally planar shapes and the first level contact hole may be wider than the second level contact hole. In another detailed embodiment, the second level contact hole may be disposed near a central portion of the first level contact hole. In another detailed embodiment, the second conductor may be electrically isolated from the first contact plug in the second element region.

In a detailed exemplary embodiment, the contact plug in the outermost region of the first element region may be terminated within the intermediate insulating film and may not be electrically connected to the conductors. Therefore, it is possible to prevent short-circuiting between the first conductors (such as word lines) and the second conductors (such as bit lines) and to obviate a problem that a dimension or shape thereof becomes different between an element region and another element region. Moreover, it is possible to accommodate positional misalignment of the contact hole. Therefore, it is possible to suppress an increase in the distance between the memory cells as much as possible, and to thus realize a miniaturization of the semiconductor device having the contact hole formed by the self-aligned contact etching method.

In another exemplary embodiment, a semiconductor device may include an intermediate insulating film formed over a plurality of first conductors formed over a semiconductor substrate; a plurality of contact holes formed in the intermediate insulating film and disposed over the plurality of first conductors; a plurality of contact plugs in the plurality of contact holes, respectively; and a plurality of second conductors formed over the plurality of contact plugs in the intermediate insulating film, respectively, and electrically connected to the plurality of first conductors via the contact plugs. The semiconductor substrate may have formed thereon a first element region where the plurality of first conductors and the plurality of contact plugs are provided in a first arrangement; and a second element region disposed at least partially around the first element region, where the plurality of first conductors and the plurality of contact plugs are provided in a second arrangement, and the first element region may include an outermost region disposed near the second element region, in which at least a majority of the contact plugs are terminated below an upper surface of the intermediate insulating film.

In a detailed embodiment, the first arrangement may have a greater density than the second arrangement. In another detailed embodiment, the first element region may be a memory cell array portion including a plurality of memory cells, and each of the contact plugs may be formed over active regions of two neighboring memory cells. In another detailed embodiment, each of the contact plugs of the first element region other than the outermost region may include a first level contact portion connected to the first conductor and a second level contact portion stacked on the first level contact portion, and a plurality of the contact plugs of the outermost region of the first element region may include only a respective first contact portion connected to the first conductor and may not include a second level contact portion. In another detailed embodiment, the first level contact portion and the second level contact portion may have generally planar shapes and the first level contact portion may be wider than the second level contact portion. In another detailed embodiment, the second level contact portion may be disposed near a central portion of the first level contact portion.

These and other features and advantages will become apparent to those skilled in the art upon consideration of the following detailed description of exemplary embodiments. The drawings are only to serve for reference and illustrative purposes, and are not intended to limit the scope of the disclosure.

BRIEF DESCRIPTION OF THE DRAWINGS

The detailed description refers to the following figures in which.

DETAILED DESCRIPTION

A detailed description of an exemplary embodiment of a semiconductor memory device is provided hereinbelow with reference to the accompanying drawings.

Figure 1A:
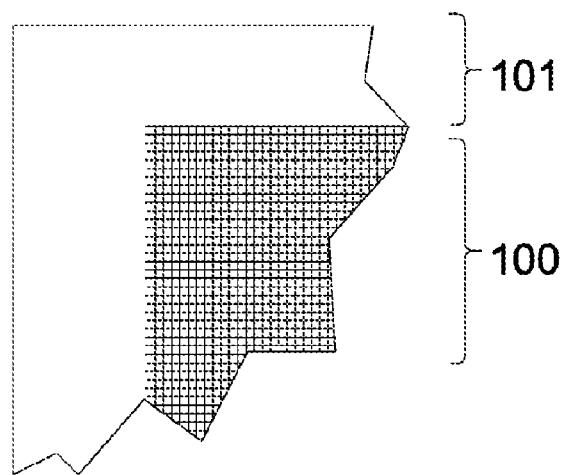
FIGS. 1A and 1B are partial plan views illustrating a wiring layout and structure of an exemplary conventional memory cell.
Figure 1B:
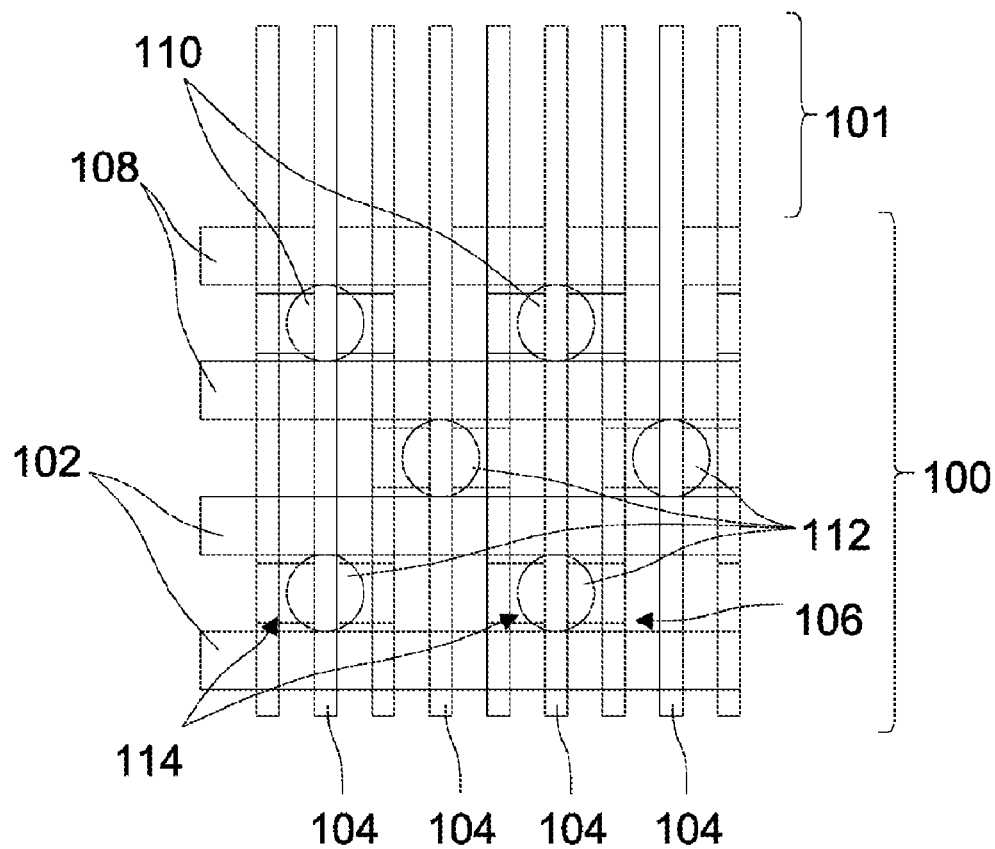
Figure 2:
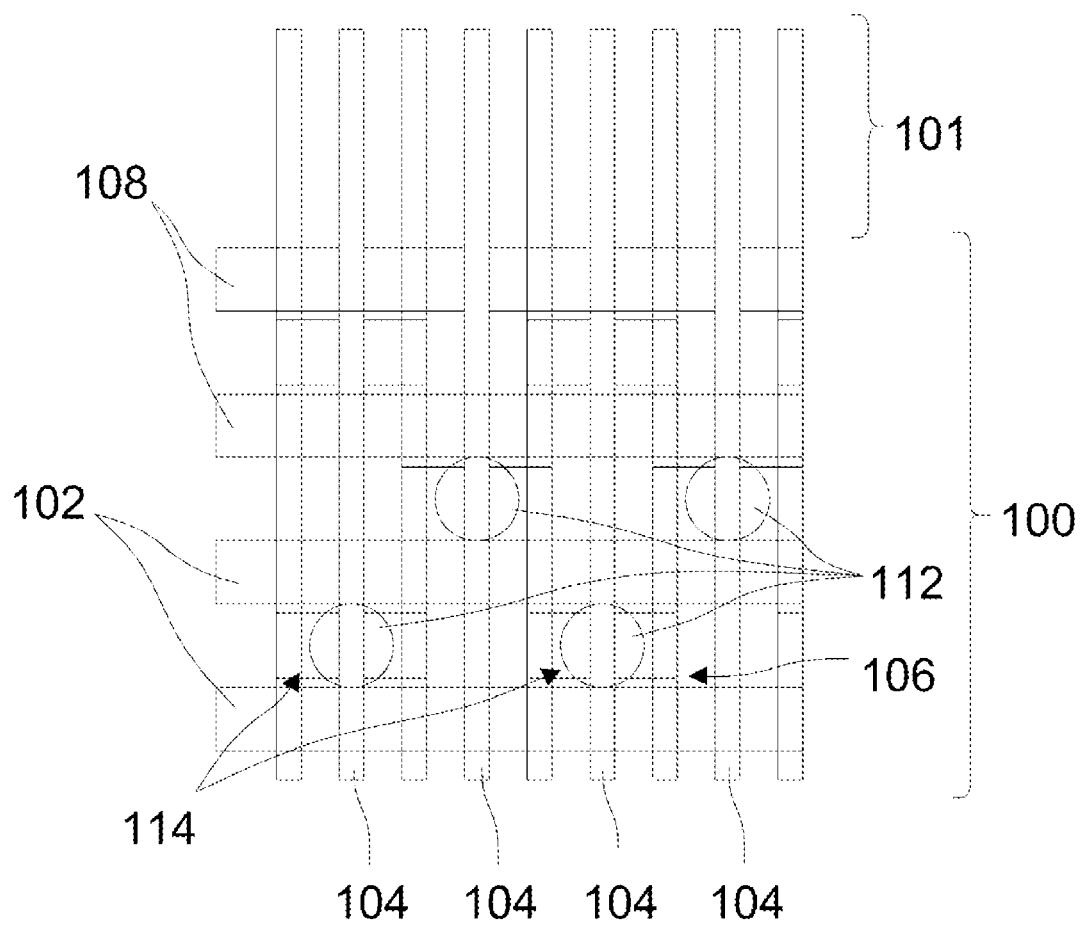
FIG. 2 is another partial plan view illustrating the wiring layout and structure of another exemplary conventional memory cell.
Figure 3:
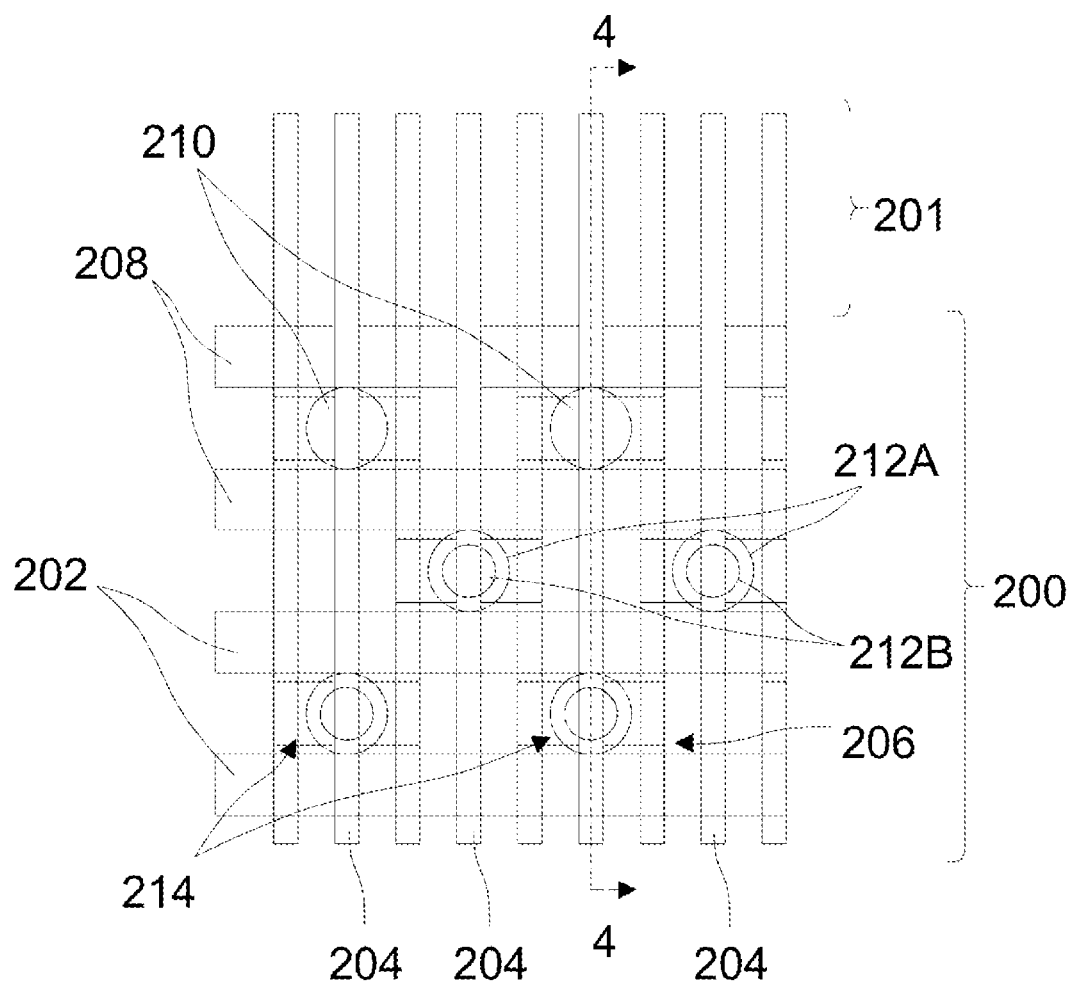
FIG. 3 is an enlarged, partial plan view of an exemplary semiconductor memory device.
Figure 4:
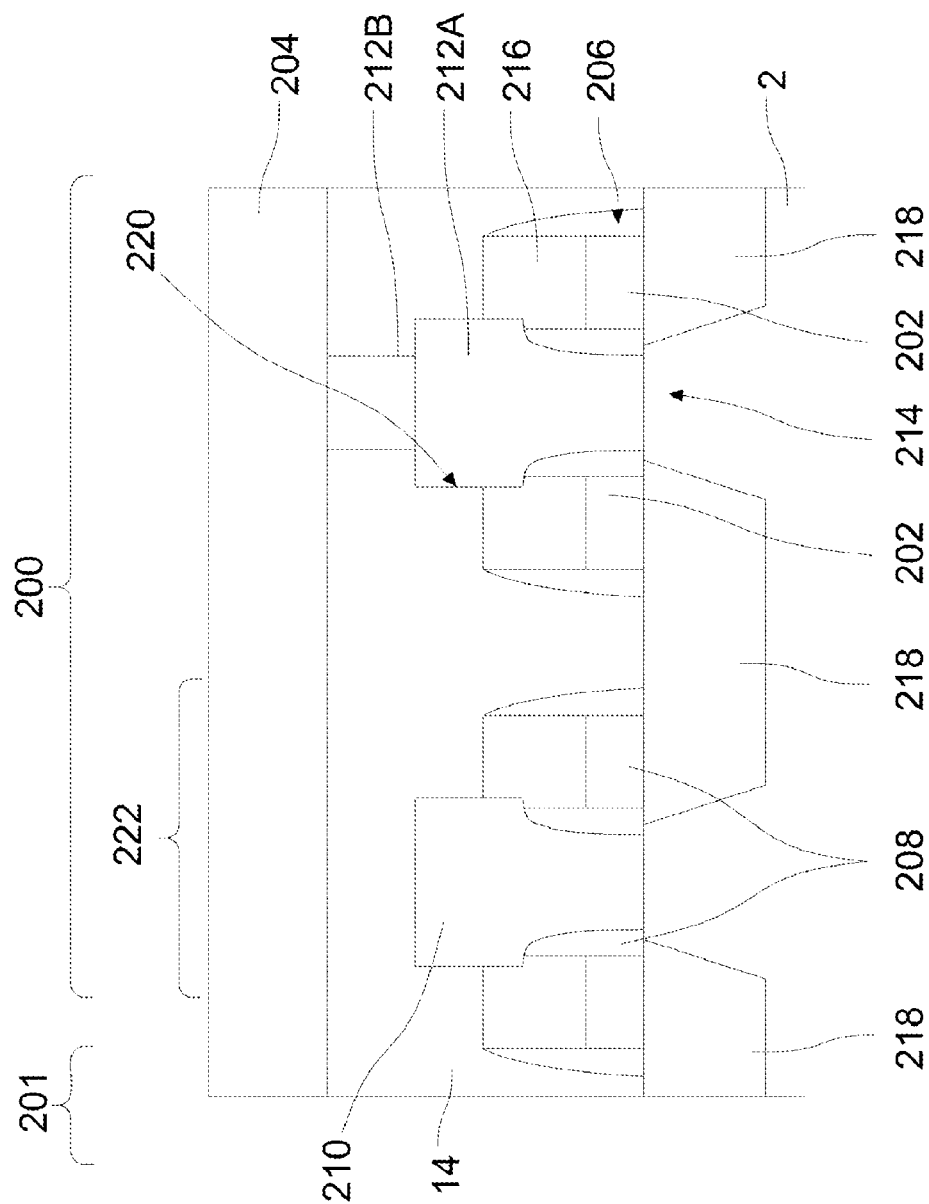
FIG. 4 is a sectional view taken along the line 4-4 in FIG. 3.

An exemplary layout and structure of a memory cell array portion 200 and a dummy contact 210 near an exterior 201 of the memory cell array portion 200 in a semiconductor memory device is illustrated in FIGS. 3 and 4. FIG. 3 is an enlarged, partial plan view of an exemplary semiconductor memory device. FIG. 4 is a sectional view taken along the line 4-4 in FIG. 3.

As illustrated in FIG. 3, the memory cell array portion 200 of the exemplary semiconductor memory device includes a plurality of mutually parallel word lines 202, a plurality of bit lines 204 intersecting the plurality of word lines 202, and a plurality of memory cells 206 formed at intersections of the word lines 202 and the bit lines 204. In an exterior 201 of the memory cell array portion 200 of the semiconductor memory device, peripheral circuits such as a sense amplifier or a decoder may be formed in a pattern having a density lower than that of the memory cell array portion 200 (high-density pattern).

As illustrated in FIG. 4, an exemplary embodiment includes a memory cell 206, a word line 202 protected by a hard mask 216, and an active region 214. A shallow trench isolation 218 (which may be an oxide film) is formed at both sides of the active region 214. Although dummy bit lines are not illustrated, they may be provided in some embodiments. Moreover, an intermediate insulating film 14 is formed on a plurality of memory cells 206 on a semiconductor substrate 2.

As illustrated in FIG. 4, the active region 214 is connected to a bit line 204 via a contact plug formed by stacking a first contact portion 212A and a second contact portion 212B. That is, in the memory cell array portion 200, contact plugs (the first contact portion 212A and the second contact portion 212B) are formed on the memory cells 206 buried in contact holes 220 disposed on the memory cells 206. The memory cells 206 are electrically connected to the bit lines 204 on the intermediate insulating film 14 via the contact plugs.

The memory cell array portion 200 includes an outermost region 222 disposed close to the exterior 201 of the memory cell array portion 200, in which the dummy contact plug 210 is buried by being terminated within in the intermediate insulating film 14.

As illustrated in FIGS. 3 and 4, the contact plugs (the first contact portion 212A and the second contact portion 212B) are provided in the interior of the memory cell array portion 200, while a corresponding second contact portion (corresponding to 212B) is not provided in the outermost region 222. With such an arrangement, the first dummy contact portion 210 that is buried within in the intermediate insulating film 14 is not connected to the bit line 204.

In the exemplary embodiment, the first dummy contact portion 210 in the outermost region 222 has the same dimension or shape as that of the first contact portion 212A provided in the interior of the memory cell array portion 200.

An operation of writing/reading data to/from a specific memory cell 206 is carried out when an arbitrary one of the word lines 202 and an arbitrary one of the bit lines 204 are selected. An electric potential applied to the bit line 204 is sequentially written to the second contact portion 212B and the first contact portion 212A to be applied to the active region 214. Since the first dummy contact portion 210 does not have the second contact portion (corresponding to 212B), the electric potential applied to the bit line 204 is not applied to the first dummy contact portion 210.

As illustrated in FIG. 4, an advantage of this exemplary embodiment is that since the first dummy contact portion 210 is arranged as a dummy portion, the first dummy contact portion 210 in the outermost region 222 can be formed in the same dimension or shape as that of the interior of the memory cell array portion 200. Owing to such a configuration, characteristics such as a contact resistance or a contact leak can be made the same as those of the interior of the memory cell array portion 200. Although there is a possibility of the first dummy contact portion 210 short-circuiting with the dummy word lines 208, because the first dummy contact portion 210 does not have the second contact portion (corresponding to 212B) connected to the bit lines 204, it will not be short-circuited with the bit lines 204. That is, the first contact portion 210 can take advantage of the dummy effect (ensuring a uniform dimension or shape in the outermost region 222) while preventing the disadvantages of the dummy (preventing short-circuiting between the first dummy contact portion 210 and the bit lines 204 even when the first dummy contact portion 210 is short-circuited). Such an advantage may be particularly significant when a self-aligned contact is used for forming of the contacts.

Although in the above-described exemplary embodiment the contacts are connected to the active region 214, in another embodiment the contacts may be configured to connect neighboring active regions.

Figure 5:
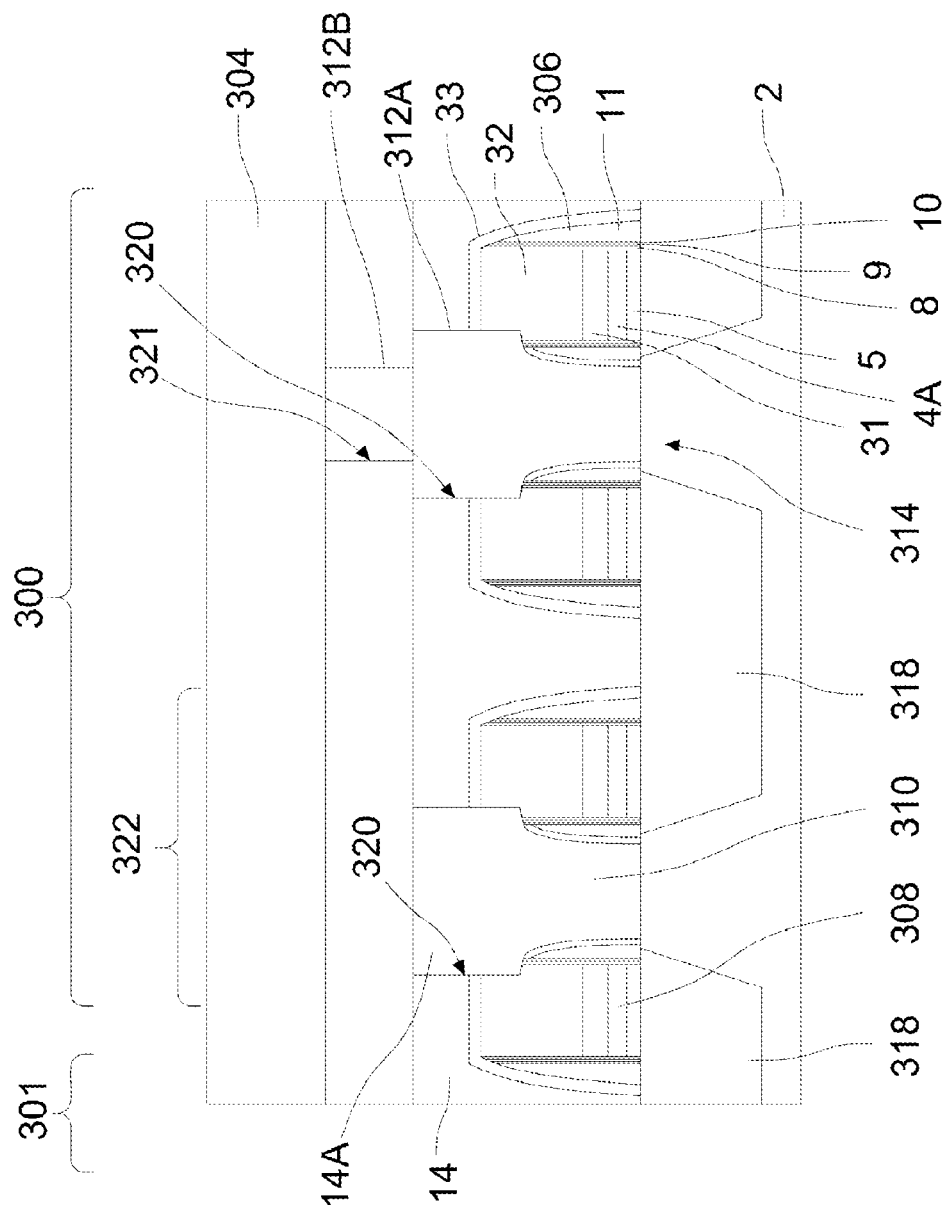
FIG. 5 is a sectional view of another exemplary semiconductor memory device.

FIG. 5 is a partial sectional view of another exemplary semiconductor memory device showing part of a memory cell array portion 300 and an exterior thereof. A semiconductor substrate 2 is formed of single crystalline silicon (Si) doped with low-density P-type impurities. A gate electrode 4A is formed of polysilicon, and a gate oxide film 5 is formed of a silicon oxide. The semiconductor substrate 2 includes a doped layer as an active region 314, formed on a surface thereof through a self alignment process. The doped layer is a diffusion layer formed by diffusing relatively high-density N-type impurities into the top surface of the semiconductor substrate 2, and the doped layer functions as a source region and a drain region. A shallow trench isolation 318 (which may be an oxide film) is formed on both sides of the active region 314. The gate oxide film 5 is formed on a portion of the semiconductor substrate 2 corresponding to a central portion between neighboring doped layers. Meanwhile, the gate electrode 4A is disposed so as to oppose the semiconductor substrate 2 with the gate oxide film 5 disposed between them, located at the central portion between the neighboring doped layers.

A silicide film 31 is a thin film formed on the gate electrode 4A formed of a silicide material being a compound of a metal material (e.g., tungsten) having a relatively high melting point and silicon, and has a function of reducing electrical resistance of the gate electrode 4A formed of polysilicon.

A hard mask nitride film 32 is thicker than the silicide film 31. It is formed of silicon nitride and stacked on the silicide film 31, and it functions as a protective film for the gate electrode 4A when a contact hole 320 is formed by a self-aligned contact etching method.

A stopper silicon nitride film 33 is thinner than the hard mask nitride film 32. It is configured to cover the hard mask nitride film 32 and the memory cells 306 formed on the semiconductor substrate 2, and it functions as a protective film for the gate electrode 4A or a charge storage nitride film 9 when the contact hole 320 is formed by a self-aligned contact etching method.

Figure 5A:
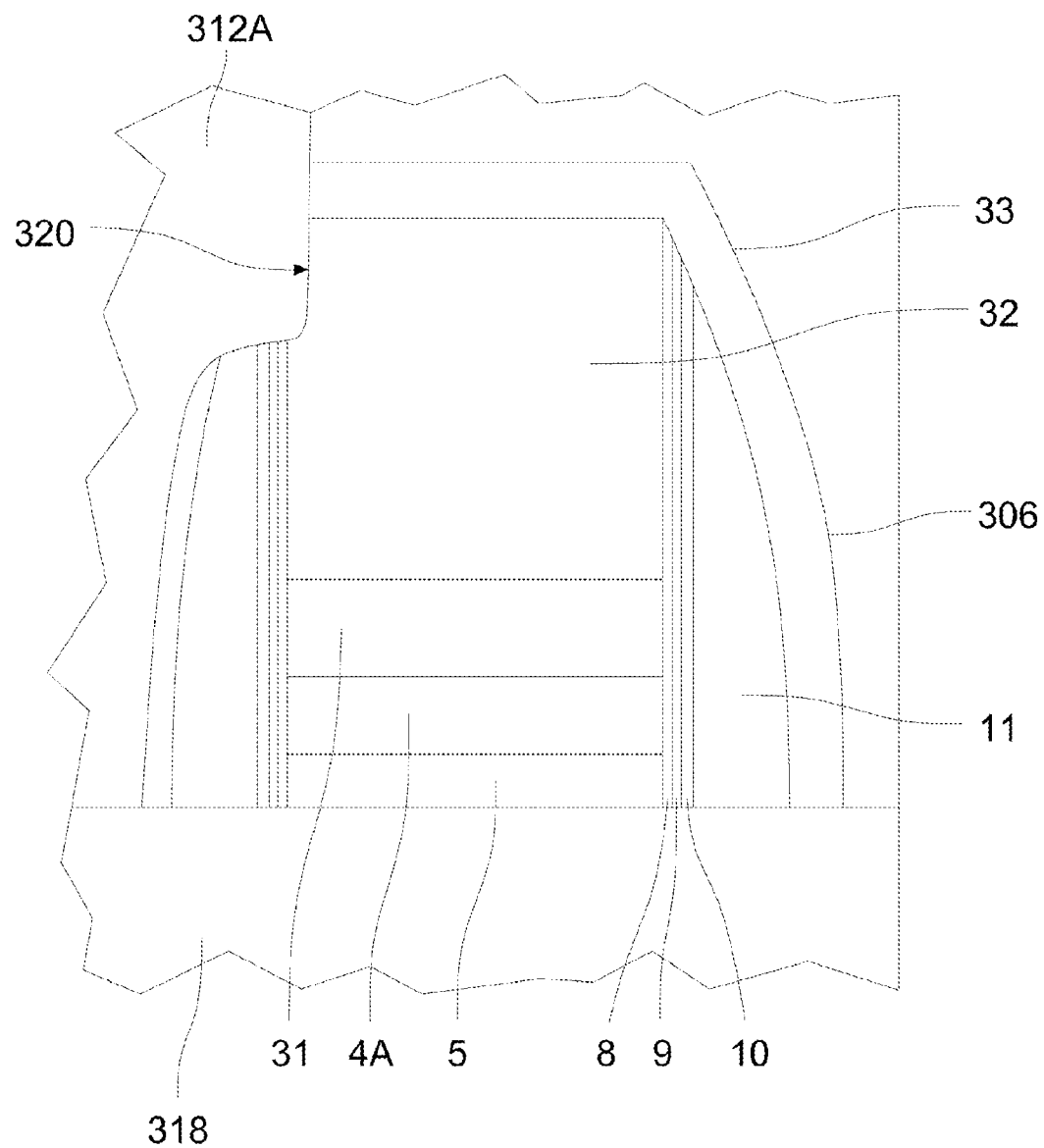
FIG. 5A is a detailed sectional view of a portion of the exemplary semiconductor memory device shown in FIG. 5.

Moreover, as shown in greater detail in FIG. 5A, the exemplary device includes a mask silicon oxide film 8 and a charge storage nitride film 9 formed of silicon nitride stacked on the mask silicon oxide film 8. A top silicon oxide film 10 is stacked on the charge storage nitride film 9 and functions as an electron barrier that prevents movement of electrons held in the charge storage nitride film 9.

A silicon nitride film 11 is formed of silicon nitride on the top silicon oxide film 10 in a side wall form having an approximately rectangular cross-sectional shape, and it functions as a protective film for the charge storage nitride film 9 during an anisotropic etching process.

The memory cell 306 is formed by stacking the mask silicon oxide film 8, the charge storage nitride film 9, the top silicon oxide film 10, and the silicon nitride film 11 in this order, and it functions as a nonvolatile memory.

An intermediate insulating film 14 is a thick insulating film formed of silicon oxide on the semiconductor substrate 2 covering an upper portion of the gate electrode 4A or the memory cell 306.

A contact hole 320, 321 is a through-hole that penetrates through the intermediate insulating film 14 and is formed between a memory cell 306 formed on a side surface of a gate electrode 4A and a memory cell 306 formed on a side surface of another neighboring gate electrode 4A.

A first contact portion 312A, a second contact portion 312B, and a first dummy contact portion 310 comprise plugs formed by burying a conductive material such as tungsten (W) in the contact holes 320, 321. The first contact portion 312A and second contact portion 312B comprise a contact plug extending from the top surface of the intermediate insulating film 14 to the top surface (the doped layer) of the semiconductor substrate 2, and electrically connect the top surface of the semiconductor substrate 2 to the bit lines 304 formed on the intermediate insulating film 14. Beneath the dummy contact 310 is a dummy word line 308.

The self-aligned contact etching method is a method in which regions including upper portions of the gate electrodes 4A are etched by an anisotropic etching process, it is detected whether or not the etching has proceeded to the hard mask nitride film 32 on the gate electrodes 4A by an end-point detection, and, thereafter, the etching of the remaining contact holes 320 is managed in terms of time based on a height of the hard mask nitride film 32 from the semiconductor substrate 2.

The contact holes 320 are configured such that on an upper surface side of the intermediate insulating film 14, the contact holes 320 are formed as a hole in a portion of the intermediate insulating film 14 corresponding to a region including a portion of each of neighboring gate electrodes 4A, so that the holes extend to the hard mask nitride film 32 and have a cross-sectional shape larger than that of a lower surface. Meanwhile, the contact holes 320 have a configuration such that on the semiconductor substrate 2 side, the contact holes 320 are narrowed down along the stopper silicon nitride film 33 formed on the memory cell 306 having a side wall form and extends to the top surface of the semiconductor substrate 2 formed between the memory cells 306 of neighboring gate electrodes 4A, thereby forming a through-hole penetrating the intermediate insulating film 14 so as to extend from the top surface of the intermediate insulating film 14 to the top surface of the semiconductor substrate 2.

Figure 6:
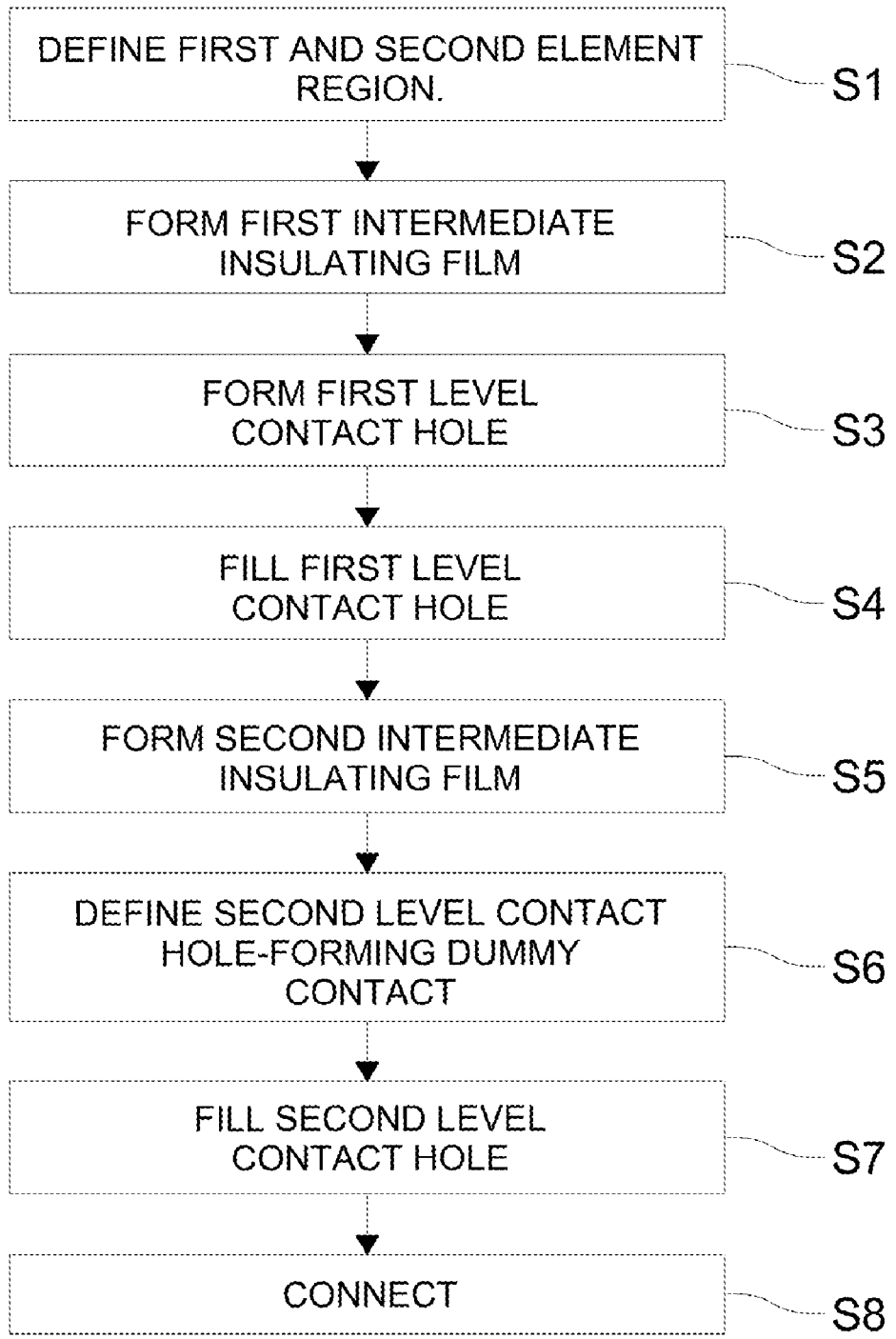
FIG. 6 is a flow chart illustrating an exemplary fabrication method for a semiconductor memory device.

Exemplary semiconductor memory devices may be fabricated using the exemplary fabrication process illustrated in the flow chart of FIG. 6. First, an element isolation layer for defining a peripheral circuit portion is formed in the semiconductor substrate. A first element region for elements such as conductor wirings and memory cells at a first density is formed, and a second element region disposed around and in the vicinity of the first element region for elements at a second density lower than the first density is defined in the semiconductor substrate.

The following description of an exemplary fabrication method focuses on the first element region. First, a silicon oxide film for forming a gate oxide film is formed, and a polysilicon film for forming a gate electrode is formed thereon. Next, a thin film of a silicide material for forming a silicide film is formed on the polysilicon film by a CVD (chemical vapor deposition) method, and a thick silicon nitride film for forming a hard mask nitride film is formed thereon. Thereafter, a resist mask is formed on the silicon nitride film so as to cover regions where the gate electrodes are to be formed by a photolithography process. Then, an exposed silicon nitride film or the like is etched by a dry etching process to expose the semiconductor substrate, so that the gate electrodes opposing the semiconductor substrate with the gate oxide film disposed between them, and a silicide film and a hard mask nitride film stacked on the gate electrodes are formed. Thereafter, the semiconductor substrate is exposed in a desired element group pattern through a photolithography process, a dry etching process, and the like. Next, a silicon oxide film or a silicon nitride film for forming the mask silicon oxide film, the charge storage nitride film, the top silicon oxide film, and the silicon nitride film is stacked on the hard mask nitride film on the gate electrodes. The semiconductor substrate is thereafter etched by an anisotropic etching process, so that an upper surface of the hard mask nitride film and an upper surface of the semiconductor substrate disposed between memory cells of neighboring gate electrodes are exposed, and a doped layer is formed in a self-aligned manner. Then, a thin stopper silicon nitride film formed of a silicon nitride is formed on the hard mask nitride film on the gate electrodes and the memory cells by a CVD method. In this way, a first and second element region defining step S1 is carried out.

After the stopper silicon nitride film is formed, a first intermediate insulating film 14 (FIG. 5) is formed so as to cover the stopper silicon nitride film (first intermediate insulating film forming step S2).

After the first intermediate insulating film 14 is formed, a resist mask having openings exposing portions of the intermediate insulating film corresponding to regions disposed between neighboring gate electrodes, including a portion of the hard mask nitride film on each of the gate electrodes, where contact holes are to be formed, is formed on the intermediate insulating film by a photolithography process. Using the resist mask as a mask, the intermediate insulating film is selectively etched by an anisotropic etching process with a large etching selection ratio of silicon oxide to silicon nitride, so that a first level contact hole is formed so as to extend to the doped layer (first level contact hole forming step S3).

After removing the resist mask, a conductive material is buried in the first level contact hole by a sputtering process or the like, so that a first contact portion 312A and a first dummy contact portion 310 (FIG. 5) are formed so as to be electrically connected to the semiconductor substrate 2 (first level contact hole filling step S4).

Thereafter, a second intermediate insulating film 14A (FIG. 5) is formed so as to cover the intermediate insulating film, the first contact portion, and the first dummy contact portion (second intermediate insulating film forming step S5).

After the second intermediate insulating film 14A is formed, another resist mask having openings exposing only the first contact portion (excluding the first dummy contact portion) is formed by a photolithography process, so that a second contact hole 321 is formed so as to extend to the first contact portion. That is, a second level contact hole 321 disposed on the first level contact hole 320 on the first conductor or a semiconductor element is formed in the second intermediate insulating film 14A, excluding the outermost region 322 of the first element region 300 disposed close to the second element region 301. In this way, a dummy contact plug (first dummy contact portion 310 (FIG. 5)) formed of a conductive material, disposed in the outermost region of the first element region and terminating in the first intermediate insulating film is defined (second level contact hole forming dummy contact defining step S6).

After removing the resist mask, a conductive material is buried in the second contact hole 321 by a sputtering process or the like, so that a second contact portion is formed so as to be electrically connected to the first contact portion (second level contact hole filling step S7).

Thereafter, bit lines 304 (FIG. 5) are formed on the second intermediate insulating film 14A so as to be electrically connected to the second contact portion (connecting step S8).

In the exemplary embodiment formed using the above-described exemplary fabrication method, even when the contact hole is formed at a position closer to one gate electrode, since the gate electrode or the charge storage nitride film is protected by the thick hard mask nitride film and the silicon nitride film, it is possible to accommodate positional misalignment without increasing the distance between memory cells of neighboring gate electrodes.

Moreover, in this exemplary embodiment, since the thick hard mask nitride film or the silicon nitride film 11 is formed on the gate electrodes and the memory cells, it is possible to ensure the protection function even with a thin stopper silicon nitride film. Therefore, it is possible to minimize the distance between the memory cells of adjacent gate electrodes as much as possible, and to thus permit miniaturization of the semiconductor memory device having the contact hole formed by the self-aligned contact etching method.

Although the doped layer has been described above as being doped with N-type impurities, the doped layer may be doped with P-type impurities. The number of silicon oxide films and silicon nitride films stacked on the charge storage nitride film is not limited as long as a silicon nitride film is formed as an uppermost layer of the memory cells.

As described above, in an exemplary semiconductor device, the memory cell array portion has a structure in which the upper layer wirings and the active regions of the semiconductor substrate are connected by the two-level contact hole. This exemplary semiconductor device is characterized in that a through-hole (extending completely through the first and second intermediate insulating films 14, 14A) is not present in the outermost region of the memory cell array portion.

Here, when the second level contact hole (corresponding to second level contact hole 321) disposed in the outermost region 322 of the memory cell array portion is omitted, the second level contact hole 312B of the memory cell array portion disposed inside the outermost region 322 might not have a desired shape. However, it does not cause any problem for the following reasons.

Figure 7:
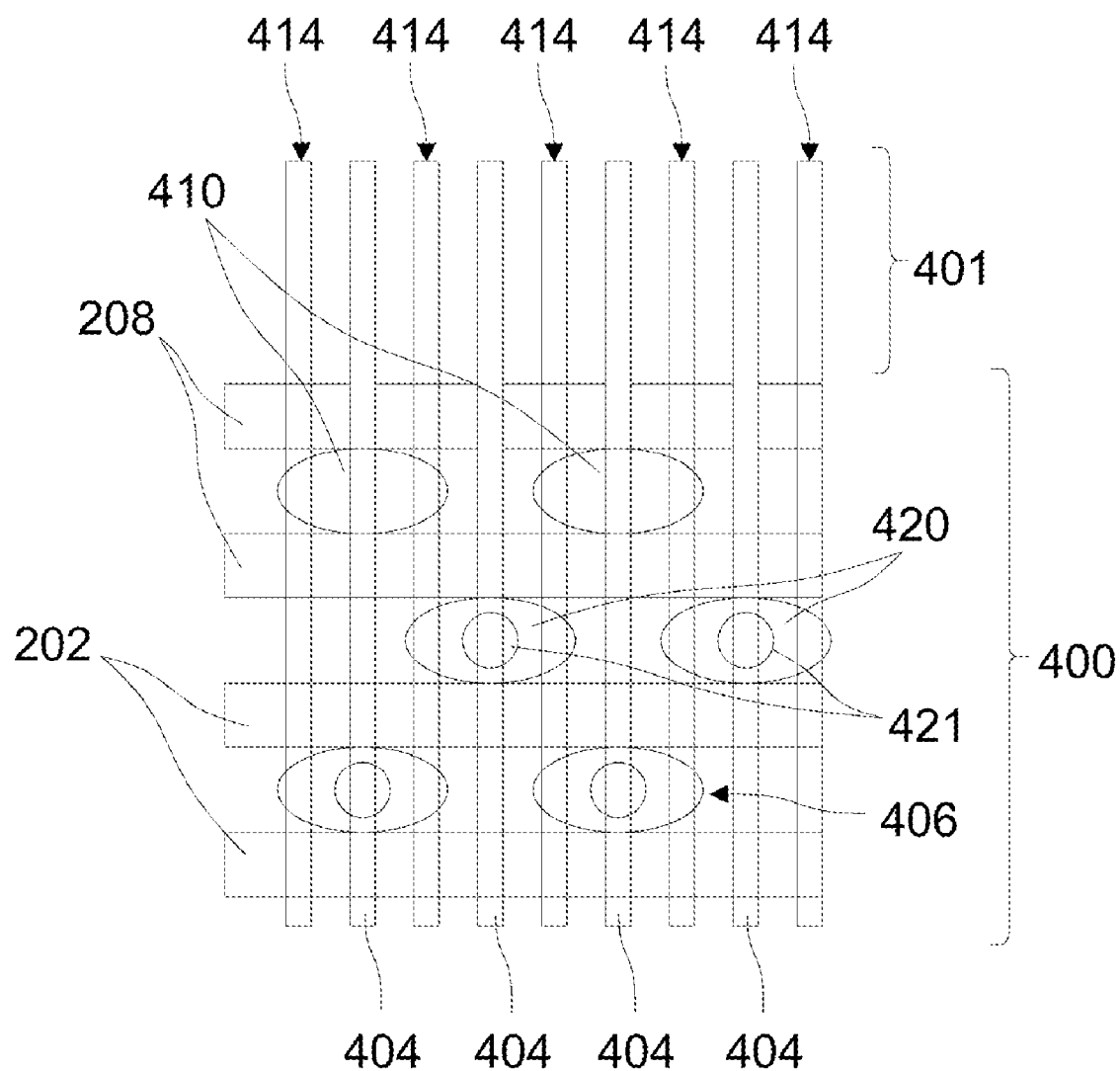
FIG. 7 is an enlarged, partial plan view of a memory cell array portion of an exemplary semiconductor memory device.

As illustrated in FIG. 7, in an exemplary memory cell array portion 400 and its exterior 401 includes memory cells 406. The first level contact holes 420 are formed on two neighboring active regions 414 and one field region present between the active regions 414. As in other embodiments, this exemplary embodiment includes bit lines 404, word lines 402, and dummy word lines 408. The first level contact hole 420 has an approximately rectangular planar shape (ending with a horizontally long, generally elliptical shape). The second level contact hole 421 is formed at an approximately central portion of the first level contact hole 420. The second level contact hole 421 has an approximately square planar shape (ending with a generally circular shape). Since the line width and line end space required by a memory cell structure decrease moving toward a lower layer, the precision in the finished dimension of the memory cell structure increases closer to the lower layer. Therefore, in order to increase the precision in a finished shape of the first level contact hole, the presence of the first level contact hole (dummy contact hole 410) disposed in the outermost region of the memory cell array portion may be helpful. Since the second level contact hole 421 does not require such a high precision as the first level contact hole 420 and the planar shape of the first level contact hole (the conductive material buried in the contact hole) disposed in the lower level is wider than that of the second level contact hole 421, it is possible to make contact with the upper layer wirings even when the shapes are slightly changed. Moreover, neighboring active regions 414 (which are preliminarily made parallel with each other) are connected by the first contact portion within the first level contact hole 420.

While exemplary embodiments have been set forth above for the purpose of disclosure, modifications of the disclosed embodiments as well as other embodiments thereof may occur to those skilled in the art. Accordingly, it is to be understood that the disclosure is not limited to the above precise embodiments and that changes may be made without departing from the scope. Likewise, it is to be understood that it is not necessary to meet any or all of the stated advantages or objects disclosed herein to fall within the scope of the disclosure, since inherent and/or unforeseen advantages of the may exist even though they may not have been explicitly discussed herein.

What is claimed is:

1. A semiconductor device comprising:
    an intermediate insulating film formed over a plurality of first conductors formed over a semiconductor substrate;
    a plurality of contact holes formed in the intermediate insulating film and disposed over the plurality of first conductors;
    a plurality of contact plugs in the plurality of contact holes, respectively; and a plurality of second conductors formed over the plurality of contact plugs in the intermediate insulating film, respectively, and electrically connected to the plurality of first conductors via the contact plugs, wherein the semiconductor substrate has formed thereon a first element region where the plurality of first conductors and the plurality of contact plugs are provided in a first density; and a second element region disposed at least partially around the first element region, where the plurality of first conductors and the plurality of contact plugs are provided in a second density lower than the first density; and wherein the first element region includes an outermost region disposed near the second element region, in which at least one of the contact plugs is terminated below an upper surface of the intermediate insulating film.

2. The semiconductor device of claim 1,
wherein the first element region is a memory cell array portion including a plurality of memory cells, and
wherein each of the contact plugs is formed over active regions of two neighboring memory cells.

3. The semiconductor device of claim 1,
wherein each of the contact plugs of the first element region other than the outermost region includes a first level contact portion connected to the first conductor and a second level contact portion stacked on the first level contact portion; and
wherein a plurality of the contact plugs of the outermost region of the first element region includes only a respective first contact portion connected to the first conductor and does not include a second level contact portion.

4. The semiconductor device of claim 3,
wherein the first element region is a memory cell array portion including a plurality of memory cells, and
wherein each of the first level contact portions is formed over active regions of two neighboring memory cells.

5. The semiconductor device of claim 3, wherein the first level contact portion and the second level contact portion have generally planar shapes and the first level contact portion is wider than the second level contact portion.

6. The semiconductor device of claim 5,
wherein the first element region is a memory cell array portion including a plurality of memory cells, and
wherein each of the first level contact portions is formed over active regions of two neighboring memory cells.

7. The semiconductor device of claim 5, wherein the second level contact portion is disposed near a central portion of the first level contact portion.

8. The semiconductor device of claim 7,
wherein the first element region is a memory cell array portion including a plurality of memory cells, and
wherein each of the first level contact portions is formed over active regions of two neighboring memory cells.

9. A semiconductor device comprising:
an intermediate insulating film formed over a plurality of first conductors formed over a semiconductor substrate;
a plurality of contact holes formed in the intermediate insulating film and disposed over the plurality of first conductors;
a plurality of contact plugs in the plurality of contact holes, respectively; and
a plurality of second conductors formed over the plurality of contact plugs in the intermediate insulating film, respectively, and electrically connected to the plurality of first conductors via the contact plugs,
wherein the semiconductor substrate has formed thereon a first element region where the plurality of first conductors and the plurality of contact plugs are provided in a first arrangement; and a second element region disposed at least partially around the first element region, where the plurality of first conductors and the plurality of contact plugs are provided in a second arrangement; and
wherein the first element region includes an outermost region disposed near the second element region, in which at least a majority of the contact plugs are terminated below an upper surface of the intermediate insulating film.

10. The semiconductor device of claim 9, wherein the first arrangement has a greater density than the second arrangement.

11. The semiconductor device of claim 9,
wherein the first element region is a memory cell array portion including a plurality of memory cells, and
wherein each of the contact plugs is formed over active regions of two neighboring memory cells.

12. The semiconductor device of claim 9,
wherein each of the contact plugs of the first element region other than the outermost region includes a first level contact portion connected to the first conductor and a second level contact portion stacked on the first level contact portion; and
wherein a plurality of the contact plugs of the outermost region of the first element region includes only a respective first contact portion connected to the first conductor and does not include a second level contact portion.

13. The semiconductor device of claim 12,
wherein the first element region is a memory cell array portion including a plurality of memory cells, and
wherein each of the first level contact portions is formed over active regions of two neighboring memory cells.

14. The semiconductor device of claim 12, wherein the first level contact portion and the second level contact portion have generally planar shapes and the first level contact portion is wider than the second level contact portion.

15. The semiconductor device of claim 14,
wherein the first element region is a memory cell array portion including a plurality of memory cells, and
wherein each of the first level contact portions is formed over active regions of two neighboring memory cells.

16. The semiconductor device of claim 14, wherein the second level contact portion is disposed near a central portion of the first level contact portion.

* * * * *